(12) United States Patent
Chen et al.

(10) Patent No.: US 11,745,160 B2
(45) Date of Patent: Sep. 5, 2023

(54) MAGNETICALLY-CONTROLLED GRAPHENE-BASED MICRO-/NANO-MOTOR AND FABRICATION METHOD THEREOF

(71) Applicant: Guangdong University of Technology, Guangzhou (CN)

(72) Inventors: Yun Chen, Guangzhou (CN); Yuanhui Guo, Guangzhou (CN); Bin Xie, Guangzhou (CN); Lu Yan, Guangzhou (CN); Maoxiang Hou, Guangzhou (CN); Xin Chen, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 17/968,960

(22) Filed: Oct. 19, 2022

(65) Prior Publication Data

US 2023/0048134 A1    Feb. 16, 2023

(30) Foreign Application Priority Data

Mar. 28, 2022 (CN) .......................... 202210311236.1

(51) Int. Cl.

| | | |
|---|---|---|
| B01J 20/02 | (2006.01) | |
| B01J 20/20 | (2006.01) | |
| B01J 20/28 | (2006.01) | |
| B01J 20/30 | (2006.01) | |
| B01J 20/32 | (2006.01) | |
| C23C 14/02 | (2006.01) | |
| C23C 14/08 | (2006.01) | |
| C23C 14/18 | (2006.01) | |
| C23C 14/35 | (2006.01) | |
| C02F 1/28 | (2023.01) | |
| C02F 1/72 | (2023.01) | |
| C02F 101/20 | (2006.01) | |
| C02F 101/32 | (2006.01) | |

(52) U.S. Cl.
CPC ......... *B01J 20/0229* (2013.01); *B01J 20/205* (2013.01); *B01J 20/28009* (2013.01); *B01J 20/3078* (2013.01); *B01J 20/3204* (2013.01); *B01J 20/324* (2013.01); *B01J 20/3214* (2013.01); *C23C 14/022* (2013.01); *C23C 14/08* (2013.01); *C23C 14/185* (2013.01); *C23C 14/35* (2013.01); *C02F 1/281* (2013.01); *C02F 1/283* (2013.01); *C02F 1/288* (2013.01); *C02F 1/725* (2013.01); *C02F 2101/20* (2013.01); *C02F 2101/327* (2013.01); *C02F 2305/08* (2013.01)

(58) Field of Classification Search
CPC ...................................................... B82Y 40/00
See application file for complete search history.

(56) References Cited

FOREIGN PATENT DOCUMENTS

| | | |
|---|---|---|
| CN | 102120574 A | 7/2011 |
| CN | 105381784 A | 3/2016 |
| CN | 106215864 A | 12/2016 |
| CN | 108745329 A | 11/2018 |
| CN | 112427009 A | 3/2021 |
| CN | 112978877 A | 6/2021 |
| EP | 3594185 A1 * | 1/2020 |
| WO | 2019136423 A1 | 7/2019 |

\* cited by examiner

*Primary Examiner* — Peter F Godenschwager

(57) ABSTRACT

A method of fabricating a magnetically-controlled graphene-based micro-/nano-motor includes: (a) mixing $FeCl_3$ crystal powder with deionized water to obtain a $FeCl_3$ solution; (b) completely immersing a carbon-based microsphere in the $FeCl_3$ solution; transferring the carbon-based microsphere from the $FeCl_3$ solution followed by heating to allow crystallization of $FeCl_3$ on the surface of the carbon-based microsphere to obtain a $FeCl_3$-carbon-based microsphere; (c) heating the $FeCl_3$-carbon-based microsphere in a vacuum chamber until there is no moisture in the vacuum chamber; continuously removing gas in the vacuum chamber and introducing oxygen; and treating the $FeCl_3$-carbon-based microsphere with a laser in an oxygen-enriched environment to obtain the magnetically controlled graphene-based micro-/nano-motor. A magnetically-controlled graphene-based micro-/nano-motor is further provided.

9 Claims, No Drawings

MAGNETICALLY-CONTROLLED GRAPHENE-BASED MICRO-/NANO-MOTOR AND FABRICATION METHOD THEREOF

CROSS-REFERENCE TO RELATED APPLICATIONS

This application claims the benefit of priority from Chinese Patent Application No. 202210311236.1, filed on Mar. 28, 2022. The content of the aforementioned application, including any intervening amendments thereto, is incorporated herein by reference in its entirety.

TECHNICAL FIELD

The application relates to catalytic self-propelled micro-/nano-motors, and more particularly to a magnetically-controlled graphene-based micro-/nano-motor and a fabrication method thereof.

BACKGROUND

With the acceleration of industrialization and urbanization and the continuous development of industries, such as electroplating industry, mining industry, and battery manufacturing industry, over the past several decades, the water pollution, especially heavy metal (mercury, cadmium, chromium and lead) pollution, has become increasingly serious. Heavy metals can stably exist in the water for a long time, and then are accumulated in the organism along the food chain, threatening the biological system. Heavy metal pollution is characterized by high toxicity, environmental persistence, strong concealment, and bioaccumulation, and has been recognized as one of the most harmful pollutants. Therefore, it is urgently required to develop an approach for rapid and efficient removal and recovery of heavy metals in water resources.

Currently, the water pollution is treated mainly by chemical precipitation, membrane filtration, and adsorption, and with the advancement of nanotechnology, the efficiency of adsorption materials in sewage treatment has been further enhanced. Catalytic self-propelled micro-/nano-motors have been widely used in the treatment of the heavy metal pollution in water resources, and structurally-diverse micro/nanomotors have been continuously designed. Due to the excellent adsorption characteristic and high specific surface area of the micro-/nano-motor itself, the treatment efficiency of the adsorption material is significantly improved, and the treatment time is greatly shortened through the high-speed self-propelling motion of the micro-/nano-motors.

Chinese patent application publication No. 112978877A discloses a dynamic sewage purification method based on micro-/nano-motors, in which the Platymonas is functionalized with $\delta$-$MnO_2$@PI/$Fe_3O_4$ to generate oxidizing hydroxyl groups to remove pollutants. However, the loading mechanical strength is relatively low, and the loaded 6-$MnO_2$@PI/$Fe_3O_4$ is easy to fall off and fail, which affects the recovery and reuse efficiency. Moreover, the highly oxidizing hydroxyl groups only play a role in the disinfection, decolorization, and removal of organic pollutants, but cannot effectively eliminate other harmful heavy metal ions, such as $Pb^{2+}$, $Cr^{6+}$, and $Cu^{2+}$.

Chinese patent application publication No. 106215864A discloses a magnetic graphene oxide-based sewage treatment agent for adsorbing heavy metal ions and a preparation method thereof, in which the magnetic nano-$Fe_3O_4$ and graphene oxide are modified by a siloxane coupling agent to obtain the treatment agent. Unfortunately, the sewage treatment agent has a limited adsorption range, and is not easy to recycle, which may cause secondary water pollution.

In summary, the existing micro-/nano-motors for sewage treatment struggle with single treatment type, and limited removal efficiency of various heavy metal ions. Moreover, they fail to simultaneously enable the wide-range, high-efficiency, and large-capacity adsorption.

SUMMARY

An object of this application is to provide a method of fabricating a magnetically-controlled graphene-based micro-/nano-motor, which has simple operation and strong operability, and brings improved specific surface area and porosity, facilitating adsorbing various heavy metal ions and organic pollutants in the water.

Another object of this application is to provide a magnetically-controlled graphene-based micro-/nano-motor fabricated by the above method, which can simultaneously adsorb various heavy metal ions and organic pollutants in the water, and effectively enhance the diversification and flexibility of the sewage treatment.

Technical solutions of this application are described as follows.

In a first aspect, this application provides a method of fabricating a magnetically-controlled graphene-based micro-/nano-motor, including:

(a) mixing $FeCl_3$ crystal powder with deionized water to obtain a $FeCl_3$ solution;

(b) completely immersing a carbon-based microsphere in the $FeCl_3$ solution; and transferring the carbon-based microsphere from the $FeCl_3$ solution followed by heating to allow crystallization of $FeCl_3$ on the surface of the carbon-based microsphere, so as to obtain a $FeCl_3$-carbon-based microsphere; and (c) heating the $FeCl_3$-carbon-based microsphere in a vacuum chamber until there is no moisture in the vacuum chamber; continuously pumping gas in the vacuum chamber away and introducing oxygen to create an oxygen-enriched environment in the vacuum chamber; and subjecting the $FeCl_3$-carbon-based microsphere to laser processing with a laser in the oxygen-enriched environment to obtain the magnetically-controlled graphene-based micro-/nano-motor.

In an embodiment, in step (a), a mass ratio of the $FeCl_3$ crystal powder to the deionized water is 1:(2~4).

In an embodiment, in step (b), the carbon-based microsphere is polyimide microsphere and polyetherimide microsphere.

In an embodiment, in step (b), the heating is performed at 40–60° C.

In an embodiment, in step (c), when the gas in the vacuum chamber is pumped away to reach a vacuum degree of (4~5)×$10^{-5}$ Torr, oxygen is introduced; and the gas in the vacuum chamber is continuously pumped away, and oxygen is continuously introduced such that a pressure in the vacuum chamber is maintained at (3.2~4.2)×$10^{-5}$ Torr.

In an embodiment, in step (c), the laser emits an ultraviolet laser with a wavelength of 350~360 nm and a power of 10~15 W.

In an embodiment, the step (b) further includes:

prior to immersing the carbon-based microsphere in the $FeCl_3$ solution, placing the carbon-based microsphere in a working area of a plasma cleaner, and introducing oxygen into the working area of the plasma cleaner to clean the carbon-based microsphere.

In an embodiment, an introduced oxygen pressure in the plasma cleaner is 0.1~0.3 Nl/h, and the carbon-based microsphere is cleaned for 4~6 min.

In an embodiment, the method further includes:

(d) placing a metal target in a magnetron sputtering coating machine; and placing the magnetically-controlled graphene-based micro-/nano-motor in a coating area of the magnetron sputtering coating machine for coating; wherein the metal target is a transition metal oxide, Pt, Ag or a combination thereof.

This application further provides a magnetically-controlled graphene-based micro-/nano-motor prepared by the above-mentioned method.

Compared to the prior art, this application has the following beneficial effects.

1. The raw material carbon-based microspheres are readily available, and with the help of the laser processing, the fabrication method is suitable for the large-scale industrial production.

2. The graphene microspheres prepared from the carbon-based microspheres have improved porosity and specific surface area, such that the contact area between the catalyst and sewage is increased, enhancing the removal efficiency of heavy metal ions and organic pollutants.

3. The $Fe_3O_4$-doped graphene microspheres fabricated by laser processing have magnetron characteristics, which improves the recycling rate and mechanical properties, thereby avoiding secondary pollution.

DETAILED DESCRIPTION OF EMBODIMENTS

The disclosure will be described in detail below in conjunction with the embodiments. The following embodiments are merely illustrative, and are not intended to limit the disclosure. It should be understood that any modifications and replacements by those skilled in the art without departing from the spirit of the disclosure should fall within the scope of the disclosure defined by the appended claims.

This application provides a fabrication method of a magnetically-controlled graphene-based micro-/nano-motor, which is performed as follows.

(a) $FeCl_3$ crystal powder is mixed with deionized water to obtain a $FeCl_3$ solution.

(b) Carbon-based microspheres are completely immersed in the $FeCl_3$ solution and then transferred from the $FeCl_3$ solution followed by heating to allow crystallization of $FeCl_3$ on the surface of the carbon-based microsphere, so as to obtain a $FeCl_3$-carbon-based microsphere.

(c) The $FeCl_3$-carbon-based microsphere is heated in a vacuum chamber until there is no moisture in the vacuum chamber. Gas in the vacuum chamber is continuously pumped away and introduced oxygen to create an oxygen-enriched environment in the vacuum chamber. The $FeCl_3$-carbon-based microsphere is performed with laser processing with a laser in the oxygen-enriched environment to obtain the magnetically-controlled graphene-based micro-/nano-motor.

Currently, the water pollution is treated mainly by chemical precipitation, membrane filtration, and adsorption, and with the advancement of nanotechnology, the efficiency of adsorption materials in sewage treatment has been further enhanced. Catalytic self-propelled micro-/nano-motors have been widely used in the treatment of the heavy metal pollution in water resources, and structurally-diverse micro/nanomotors have been continuously designed. Due to the excellent adsorption characteristic and high specific surface area of the micro-/nano-motor itself, the treatment efficiency of the adsorption material is significantly improved, and the treatment time is greatly shortened through the high-speed self-propelling motion of the micro-/nano-motors. However, the existing micro/nanomotors for sewage treatment have the technical problems of single treatment type, limited functionalization method for removing various heavy metal ions, and the adsorption range, efficiency and adsorption capacity of treatment agents cannot be ensured at the same time.

In view of the deficiencies in the prior art, this application provides the method of fabricating a magnetically-controlled graphene-based micro-/nano-motor. Firstly, $FeCl_3$ crystal powders are mixed with deionized water to obtain the uniform $FeCl_3$ aqueous solution. Then, carbon-based microspheres are completely immersed in the $FeCl_3$ solution and then transferred from the $FeCl_3$ solution followed by heating to allow uniform crystallization into $FeCl_3 \cdot 6H_2O$ on the surface of the carbon-based microspheres. In order to prevent $FeCl_3$ from absorbing moisture from the air in the vacuum chamber after heating, the heating is required to be continuously performed after the carbon-based microspheres are placed in the vacuum chamber until there is no moisture in the vacuum chamber.

$FeCl_3$-carbon-based microspheres are treated by the laser in the oxygen-rich environment, and the laser can penetrate through the $FeCl_3$ crystalline layer and act on the $FeCl_3$ crystals and carbon-based microspheres simultaneously to form graphene microspheres doped with $Fe_3O_4$, that is, magnetically-controlled graphene-based micro-/nano-motors. Due to the large single-photon energy of the laser beam, and when the laser acts on the carbon-based microspheres covered with $FeCl_3$ crystals, the ferric ions in $FeCl_3$ undergo the redox reaction with oxygen to generate $Fe_3O_4$ nanoparticles. At the same time, the laser beam can penetrate the $FeCl_3$ crystal due to the photothermal effect and act on the carbon-based microspheres. The molecular bonds between the atoms in the carbon-based microspheres of non-metallic materials are broken under the action of high-energy photons, and the various atoms in the non-metallic materials are separated and recombined, so that most of the carbon atoms in the carbon-based microspheres are recombined to produce graphene. Some of the carbon atoms in the carbon-based microspheres will form gases with oxygen atoms such as carbon monoxide and carbon dioxide. In order to avoid the produced gas affecting the laser treatment, in this solution, the gas generated in the vacuum chamber is continuously released and oxygen is continuously inlet, so that the vacuum chamber always remains oxygen-rich state. The graphene surface induced by the laser has large amounts of holes which facilitate fixing and attaching the $Fe_3O_4$ nanoparticles on graphene surface, thereby forming graphene microspheres doped with $Fe_3O_4$.

Porous graphene produced in the oxygen-rich environment increases the specific surface area and has large amounts of oxygen-containing groups on the surface. The oxygen-containing groups can be complexed and adsorb with heavy metal ions and organic pollutants, so as to adsorb and remove heavy metal ions and organic pollutants in the water, thereby realizing efficient and large adsorption of heavy metal ions and organic pollutants. Furthermore, the modified graphene microspheres doped with $Fe_3O_4$ have magnetron characteristics which make graphene microspheres doped with $Fe_3O_4$ have magnetically driven recovery properties, thereby avoiding secondary pollution of water bodies.

Compared to the prior art, this application has the following beneficial effects.

1. The raw material carbon-based microspheres are readily available, and with the help of the laser processing, the fabrication method is suitable for the large-scale industrial production.

2. The graphene microspheres prepared from the carbon-based microspheres have improved porosity and specific surface area, such that the contact area between the catalyst and sewage is increased, enhancing the removal efficiency of heavy metal ions and organic pollutants.

3. The $Fe_3O_4$-doped graphene microspheres fabricated by laser processing have magnetron characteristics, which improves the recycling rate and mechanical properties, thereby avoiding secondary pollution.

In an embodiment, in step (a), a mass ratio of the $FeCl_3$ crystal powder to the deionized water is 1:(2~4).

The mass ratio of $FeCl_3$ crystal powders and deionized water affects the content of $Fe_3O_4$ doped in the graphene microspheres after the laser treatment. If the mass ratio of $FeCl_3$ crystal powders and deionized water is too low, it is easy to result in too low content of the $Fe_3O_4$ doped in the graphene microspheres. If the mass ratio is too high, it is prone to increase the thickness of the $FeCl_3$ crystals formed on the surface of the carbon-based microspheres, resulting in that the laser fails to completely penetrate the crystal layer to completely convert the middle carbon-based microspheres into graphene.

In an embodiment, in step (a), the mass ratio of the $FeCl_3$ crystal powder to the deionized water is 1:2.

In an embodiment, in step (b), the carbon-based microsphere is polyimide microsphere and polyetherimide microsphere.

Carbon-based microspheres are easy to obtain, have less resistance in water than carbon-based materials having other shapes, are more conducive to laser processing, and simplify the processing steps.

In an embodiment, in step (b), the heating is performed at 40~60° C.

$FeCl_3$ is well soluble in water and has strong water absorption. When $FeCl_3$ aqueous solution is exposed to air, $FeCl_3$ aqueous solution is difficult to crystallize and adhere to the surface of carbon-based microspheres below 40° C. When the temperature is higher than 60° C., the water in the $FeCl_3$ aqueous solution evaporates too fast, and the hydrochloric acid formed in the aqueous solution will also volatilize together with the water molecules, causing harm to the environment and the operator.

In an embodiment, in step (c), when the gas in the vacuum chamber is pumped away to reach a vacuum degree of $(4~5)\times10^{-5}$ Torr, oxygen is introduced. The gas in the vacuum chamber is continuously pumped away, and oxygen is continuously introduced such that a pressure in the vacuum chamber is maintained at $(3.2~4.2)\times10^{-5}$ Torr.

In an embodiment, in step (c), when the vacuum degree in the vacuum chamber reaches $5\times10^{-5}$ Torr, oxygen is introduced. The pressure in the vacuum chamber is maintained at $3.5\times10^{-5}$ Torr.

In an embodiment, in step (c), the laser emits an ultraviolet laser with a wavelength of 350~360 nm and a power of 10~15 W.

The ultraviolet laser is used to realize the transformation of substances by destroying molecular bonds, which has high processing accuracy and processing of fine materials, and which can achieve the processing of carbon-based microspheres without large deformation damage to carbon-based microspheres. In a preferred embodiment, the laser wavelength of the ultraviolet laser is set to 355 nm, and the laser power is set to 10 W, which can avoid directly etching the carbon-based microspheres due to too large processing current.

In an embodiment, in step (b), prior to immersing the carbon-based microsphere in the $FeCl_3$ solution, the carbon-based microspheres are placed in a working area of a plasma cleaner and cleaned by introducing oxygen into the working area of the plasma cleaner.

In an embodiment, prior to immersing the carbon-based microsphere in the $FeCl_3$ solution, the carbon-based microspheres are cleaned by the oxygen released by the plasma cleaner. Thus, the formed plasma bombards the surface of the carbon-based microspheres, which helps to improve the hydrophilicity of the surface of the carbon-based microspheres, so that more $FeCl_3$ can be attached to the surface of the carbon-based microspheres.

In an embodiment, an introduced oxygen pressure in the plasma cleaner is 0.1~0.3 Nl/h, and the carbon-based microsphere is cleaned for 4~6 min.

In an embodiment, the introduced oxygen pressure in the plasma cleaner is 0.2 Nl/h, and the carbon-based microsphere is cleaned for 5 min.

In an embodiment, the preparation method further including step (d): placing a metal target in a magnetron sputtering coating machine; and placing the magnetically-controlled graphene-based micro-/nano-motor in a coating area of the magnetron sputtering coating machine for coating. The metal target is a transition metal oxide, Pt, Ag or a combination thereof.

In an embodiment, the magnetically-controlled graphene-based micro-/nano-motors are coated with any one or more combinations of transition metal oxides, Pt and Ag as metal targets to form the corresponding functionalized metal coatings. Since the transition metal oxides, Pt and Ag play a catalytic role, when $H_2O_2$ is used in the water body for sterilization, odor removal and deodorization, the functional metal coating can make $H_2O_2$ quickly decompose into water and oxygen. Thus, such a coating is covered on the surface of the graphene microspheres with $Fe_3O_4$, which can catalyze bubbles with rapid movement and generate hydroxyl groups with strong oxidation, which helps $H_2O_2$ quickly achieve water disinfection, decolorization, odor removal and removal of organic pollutants.

In an embodiment, in step (d), the transition metal oxides refer to any one or more combinations of $MnO_2$, $CuO_2$, $CuO$ and $ZnO$.

This application further provides a magnetically-controlled graphene-based micro-/nano-motor prepared by the method above.

The magnetically driven graphene-based micro/nanomotors can simultaneously adsorb various heavy metal ions and organic pollutants in the water body, which can effectively improve the diversity and flexibility of the micro-/nano-motors in sewage treatment.

The technical solutions of this application will be further described below in conjunction with specific embodiments.

Embodiment 1

Provided herein was a fabrication method for magnetically controlled graphene-based micro-/nano-motors.

(a) $FeCl_3$ crystal powder was mixed with deionized water in a mass ratio of 1:2 to obtain a $FeCl_3$ solution.

(b) Carbon-based microspheres were completely immersed in the $FeCl_3$ solution, transferred and heated at 40° C. to allow crystallization of the $FeCl_3$ on the surface to obtain $FeCl_3$-carbon-based microspheres.

(c) The FeCl$_3$-carbon-based microspheres were heated in a vacuum chamber until there was no moisture in the vacuum chamber. Then the vacuum chamber was vacuumized, and when a vacuum degree reached 5×10$^{-5}$ Torr, it began to introduce oxygen. The gas in the vacuum chamber was continuously pumped away, and the oxygen was continuously introduced to maintain a pressure in the vacuum chamber at 3.5×10$^{-5}$ Torr. The FeCl$_3$-carbon-based microspheres were treated by the ultraviolet laser with a wavelength of 355 nm and a power of 10 W in the oxygen-enriched environment to obtain the magnetically controlled graphene-based micro-/nano-motors.

Embodiment 2

Provided herein was a fabrication method for magnetically controlled graphene-based micro-/nano-motors.

(a) FeCl$_3$ crystal powder was mixed with deionized water in the mass ratio of 1:3 to obtain a FeCl$_3$ solution.

(b) Carbon-based microspheres were completely immersed in the FeCl$_3$ solution, transferred and heated at 50° C. to allow crystallization of the FeCl$_3$ on the surface to obtain FeCl$_3$-carbon-based microspheres.

(c) The FeCl$_3$-carbon-based microspheres were heated in a vacuum chamber until there was no moisture in the vacuum chamber. Then the vacuum chamber was vacuumized, and when a vacuum degree reached 4.5×10$^{-5}$ Torr, it began to introduce oxygen. The gas in the vacuum chamber was continuously pumped away, and the oxygen was continuously introduced to maintain a pressure in the vacuum chamber at 4.2×10$^{-5}$ Torr. The FeCl$_3$-carbon-based microspheres were treated by the ultraviolet laser with the wavelength of 355 nm and the power of 10 W in the oxygen-enriched environment to obtain the magnetically controlled graphene-based micro-/nano-motors.

Embodiment 3

Provided herein was a fabrication method for magnetically controlled graphene-based micro-/nano-motors.

(a) FeCl$_3$ crystal powder was mixed with deionized water in the mass ratio of 1:4 to obtain a FeCl$_3$ solution.

(b) Carbon-based microspheres were completely immersed in the FeCl$_3$ solution, transferred and heated at 60° C. to allow crystallization of the FeCl$_3$ on the surface to obtain FeCl$_3$-carbon-based microspheres.

(c) The FeCl$_3$-carbon-based microspheres were heated in a vacuum chamber until there was no moisture in the vacuum chamber. Then the vacuum chamber was vacuumized, and when a vacuum degree reached 4×10$^{-5}$ Torr, it began to introduce oxygen. The gas in the vacuum chamber was continuously pumped away, and the oxygen was continuously introduced to maintain a pressure in the vacuum chamber at 3.2×10$^{-5}$ Torr. The FeCl$_3$-carbon-based microspheres were treated by the ultraviolet laser with the wavelength of 355 nm and the power of 10 W in the oxygen-enriched environment to obtain the magnetically controlled graphene-based micro-/nano-motors.

Embodiment 4

Provided herein was a fabrication method for magnetically controlled graphene-based micro-/nano-motors.

(a) FeCl$_3$ crystal powder was mixed with deionized water in the mass ratio of 1:2 to obtain a FeCl$_3$ solution.

(b) The carbon-based microspheres were placed in the working area of the plasma cleaner and cleaned by introducing oxygen with a pressure of 0.2 Nl/h into the working area of the plasma cleaner, and the cleaning time was 5 min. Then carbon-based microspheres were completely immersed in the FeCl$_3$ solution, transferred and heated at 40° C. to allow crystallization of the FeCl$_3$ on the surface to obtain FeCl$_3$-carbon-based microspheres.

(c) The FeCl$_3$-carbon-based microspheres were heated in a vacuum chamber until there was no moisture in the vacuum chamber. Then the vacuum chamber was vacuumized, and when a vacuum degree reached 5×10$^{-5}$ Torr, it began to introduce oxygen. The gas in the vacuum chamber was continuously pumped away, and the oxygen was continuously introduced to maintain a pressure in the vacuum chamber at 3.5×10$^{-5}$ Torr. The FeCl$_3$-carbon-based microspheres were treated by the ultraviolet laser with the wavelength of 355 nm and the power of 10 W in the oxygen-enriched environment to obtain the magnetically controlled graphene-based micro-/nano-motors.

The magnetically controlled graphene-based micro-/nano-motors prepared in Embodiments 1~4 were applied to the sewage treatment according to the following steps.

(1) The sewage sample was analyzed by an inductively coupled plasma emission spectrometer (ICP-AES) for initial concentrations of $Pb^{2+}$, $Cu^{2+}$ and $Cd^{2+}$, and by an ultraviolet-visible (UV/VIS) spectrophotometer for the initial naphthalene concentration.

(2) The sewage sample was averagely divided into 4 parts, which were respectively added with 5 g of the micro-/nano-motors obtained in Embodiments 1-4 and reacted for 1 h.

(3) The micro-/nano-motors were recovered by an electromagnet with a magnetic field strength of 1 mT.

(4) The surface element composition of the recovered micro-/nano-motors was analyzed by using an energy dispersive X-ray spectrometer (EDX). The concentrations of $Pb^{2+}$, $Cu^{2+}$ and $Cd^{2+}$ in the treated sewage samples were determined by ICP-AES and recorded, and the naphthalene concentration was determined by UV/VIS and recorded. Analysis results were shown in Table 1.

TABLE 1

Test results of sewage before and after treated with the micro-/nano-motors

| Item | Untreated | Embodiment 1 | Embodiment 2 | Embodiment 3 | Embodiment 4 |
| --- | --- | --- | --- | --- | --- |
| $Pb^{2+}$ concentration (μg/L) | 1.9 | 0.35 | 0.82 | 1.25 | 0.06 |
| $Cu^{2+}$ concentration (mg/L) | 12.8 | 1.03 | 2.60 | 4.81 | 0.24 |

TABLE 1-continued

Test results of sewage before and after treated with the micro-/nano-motors

| Item | Untreated | Embodiment 1 | Embodiment 2 | Embodiment 3 | Embodiment 4 |
|---|---|---|---|---|---|
| $Cd^{2+}$ concentration (mg/L) | 9.6 | 0.86 | 1.29 | 3.32 | 0.06 |
| Naphthaline concentration (mg/L) | 19.3 | 2.63 | 5.95 | 13.30 | 0.13 |

As demonstrated by Table 1, the micro-/nano-motors prepared by this application can effectively adsorb various heavy metal ions and organic pollutants in the sewage. As evidenced by the surface element composition analysis conducted by EDX, $Pb^{2+}$, $Cu^{2+}$ and $Cd^{2+}$ were adsorbed on the surface of the recovered micro-/nano-motors.

Further, it can be concluded from the comparison between Embodiment 1 and Embodiment 4 that the cleaning of the carbon-based microspheres in oxygen in the plasma cleaner before immersion can improve the surface hydrophilicity of the carbon-based microspheres, such that more $FeCl_3$ can adhere to the surface, facilitating the adsorption of the carbon-based microspheres to heavy metal ions and organic pollutants.

The technical principles of this application are described in conjunction with specific embodiments above. These embodiments are merely illustrative, and are not intended to limit the disclosure. It should be understood that any modifications and replacements made by those skilled in the art without departing from the spirit of the disclosure should fall within the scope of the disclosure defined by the present claims.

What is claimed is:

1. A method of fabricating a magnetically-controlled graphene-based micro-/nano-motor, comprising:
   (a) mixing $FeCl_3$ crystal powder with deionized water to obtain a $FeCl_3$ solution;
   (b) completely immersing a carbon-based microsphere in the $FeCl_3$ solution; and transferring the carbon-based microsphere from the $FeCl_3$ solution followed by heating to allow crystallization of $FeCl_3$ on the surface of the carbon-based microsphere, so as to obtain a $FeCl_3$-carbon-based microsphere; and
   (c) heating the $FeCl_3$-carbon-based microsphere in a vacuum chamber until there is no moisture in the vacuum chamber; continuously pumping gas in the vacuum chamber away and introducing oxygen to create an oxygen-enriched environment in the vacuum chamber; and subjecting the $FeCl_3$-carbon-based microsphere to laser processing with a laser in the oxygen-enriched environment to obtain the magnetically-controlled graphene-based micro-/nano-motor.

2. The method of claim 1, wherein in step (a), a mass ratio of the $FeCl_3$ crystal powder to the deionized water is 1:(2~4).

3. The method of claim 1, wherein in step (b), the carbon-based microsphere is polyimide microsphere and polyetherimide microsphere.

4. The method of claim 1, wherein in step (b), the heating is performed at 40-60° C.

5. The method of claim 1, wherein in step (c), when the gas in the vacuum chamber is pumped away to reach a vacuum degree of $(4~5)\times10^{-5}$ Torr, oxygen is introduced; and the gas in the vacuum chamber is continuously pumped away, and oxygen is continuously introduced such that a pressure in the vacuum chamber is maintained at $(3.2~4.2)\times10^{-5}$ Torr.

6. The method of claim 1, wherein in step (c), the laser emits an ultraviolet laser with a wavelength of 350~360 nm and a power of 10~15 W.

7. The method of claim 1, wherein the step (b) further comprises:
   prior to immersing the carbon-based microsphere in the $FeCl_3$ solution, placing the carbon-based microsphere in a working area of a plasma cleaner, and introducing oxygen into the working area of the plasma cleaner to clean the carbon-based microsphere.

8. The method of claim 7, wherein an introduced oxygen pressure in the plasma cleaner is 0.1~0.3 Nl/h, and the carbon-based microsphere is cleaned for 4~6 min.

9. The method of claim 1, further comprising:
   (d) placing a metal target in a magnetron sputtering coating machine; and placing the magnetically-controlled graphene-based micro-/nano-motor in a coating area of the magnetron sputtering coating machine for coating;
   wherein the metal target is a transition metal oxide, Pt, Ag or a combination thereof.

* * * * *